United States Patent [19]
Dahne et al.

[11] Patent Number: 5,128,506
[45] Date of Patent: Jul. 7, 1992

[54] METHOD AND APPARATUS FOR SELECTIVE INFRARED SOLDERING USING SHIELDING FIXTURES

[75] Inventors: Scott E. Dahne; Govind L. Hira, both of Columbia, Md.

[73] Assignee: Westinghouse Electric Corp., Pittsburgh, Pa.

[21] Appl. No.: 605,887

[22] Filed: Oct. 30, 1990

[51] Int. Cl.$^5$ .......................... B23K 31/00; H05B 3/00
[52] U.S. Cl. ............................... 219/85.13; 228/180.1; 228/230; 392/376
[58] Field of Search ............... 219/85.12, 85.13, 85.17, 219/85.19, 388, 405, 411; 432/148, 194; 228/180.1, 180.2, 230, 232, 240, 242; 392/375, 376, 407, 408, 416, 418, 422, 425, 423, 426, 430, 436

[56] References Cited

U.S. PATENT DOCUMENTS

| | | | |
|---|---|---|---|
| 3,547,661 | 12/1970 | Stevenson | 392/407 |
| 3,710,069 | 1/1973 | Papadopoulos et al. | 219/85.12 |
| 3,717,742 | 2/1973 | Fottler | 219/85.13 |
| 3,718,800 | 2/1973 | Costello | 219/85.12 |
| 3,879,164 | 4/1975 | Haldopoulos et al. | 219/85.12 |
| 3,916,151 | 10/1975 | Reix | 219/530 |
| 3,974,358 | 8/1976 | Goltsos | 392/418 |
| 4,032,751 | 6/1977 | Youtsey et al. | 219/553 |
| 4,160,893 | 7/1979 | Meyen et al. | 219/85.12 |
| 4,563,572 | 1/1986 | Hager, Jr. | 392/423 |
| 4,654,502 | 3/1987 | Furtek | 219/85.13 |
| 4,725,716 | 2/1988 | Entwistle et al. | 219/388 |
| 4,771,929 | 9/1988 | Bahr et al. | 228/102 |
| 4,812,620 | 3/1989 | Hayakawa et al. | 219/85.12 |
| 4,817,851 | 4/1989 | Kolesar et al. | 228/20 |
| 4,833,301 | 5/1989 | Furtek | 219/388 |
| 4,876,437 | 10/1989 | Kondo | 219/388 |
| 4,938,410 | 7/1990 | Kondo | 228/180.1 |

OTHER PUBLICATIONS

IBM Technical Disclosure Bulletin, vol. 25, No. 5, pp. 1827-1829, Oct. 1979, "Method For Selective Soldering . . . ", by Crawford.

"Forced Convection: The Dark Horse", By Michael L. Martel; *Circuits Manufacturing* Feb. 1989, pp. 27-40.

"The Use of Radiant Infrared in Soldering Surface Mounted Devices to Printed Circuit Boards", By Stephen J. Dow: published by Vitronics Corporation (copyright Dec. 1984).

*Primary Examiner*—Geoffrey S. Evans
*Attorney, Agent, or Firm*—W. G. Sutcliff

[57] ABSTRACT

An apparatus and method is disclosed for making additional solder joints on a printed wiring assembly which includes a printed wiring board and components soldered previously thereto. Additional components, along with additional solder to be reflowed to form new solder joints, are placed on the assembly. A titanium shield is placed over the board to cover the already completed solder joints which are not to undergo reflow, and the assembly is passed through an oven producing both infrared and convection heating. The convection heating of the oven is set to warm the entire printed wiring assembly to a temperature which remains below the reflow temperature of the solder used to attach the preexisting components. The infrared heating of the oven is applied to the board, but is prevented from heating previously completed solder joints by the shield. The infrared heating impinges on the additional solder provided to attach the additional components, and the infrared energy in combination with the convection energy causes reflow of this solder.

50 Claims, 5 Drawing Sheets

METHOD AND APPARATUS FOR SELECTIVE INFRARED SOLDERING USING SHIELDING FIXTURES

BACKGROUND OF THE INVENTION

The present invention relates to a method and apparatus for soldering additional components to a printed wiring assembly without melting the solder used to attach components mounted to the printed wiring assembly in prior operations.

Components are often attached to a printed wiring board to form a printed wiring assembly by infrared soldering, an apparatus for which is shown in Furtek U.S. Pat. No. 4,654,502. In infrared soldering, components are applied to the board, and quantities of solder are also applied to the board in the regions where solder joints are desired. Then, the assembly is heated by infrared radiation to "reflow" or melt the solder to form solder joints. It is also known to use combinations of infrared, recirculating forced hot air heating, and focused forced hot air heating to reflow solder on an entire board, as illustrated in Bahr et al U.S. Pat. No. 4,771,929.

Sometimes it is necessary to attach components to a printed wiring assembly after a previous soldering operation has been performed in which some components have already been attached to the printed wiring board. Whenever such a second soldering step is required, joints where solder has already been melted (reflowed) must be prevented from undergoing a second reflow of their solder, since a second reflow would subject all the previously attached components to dislodging or re-alignment as well as to a second dose of, life-reducing heat. Such reflowing of the joints is always undesirable, but is particularly undesirable in constructing circuits for military applications and is generally prohibited by military specifications. Thus, if reflow is to be avoided, standard high-speed production soldering techniques such as infrared wave soldering or production oven soldering cannot be used for attaching components to a critical printed wiring assembly if even one component has already been attached to the board.

In the prior art, soldering subsequent to a first soldering operation on a given military specification board has frequently been accomplished using manual methods which are extremely time consuming and require large amounts of rework. In another known method, taught by Papadopoulos et al. U.S. Pat. No. 3,710,069, heat is applied to areas which are to be reflowed while applying fluid cooling to areas which are not to be reflowed. Papadoupoulos e al. also indicates that solders with different melting points can be used on different areas of the circuit board. In this method, the first components are attached with a first, higher temperature solder, and later components are attached at temperatures lower than the first solder temperature with a second, lower temperature solder. This method disadvantageously requires precise temperature control to avoid accidental reflow of the higher temperature solder.

In another known method, as shown in Entwistle et al. U.S. Pat. No. 4,725,716, components are infrared soldered to the first side of a board, and a heat sink is applied to the first side to prevent reflow of the solder on the first side while components are infrared soldered to the other side.

Another known method, as shown in Meyen et al. U.S. Pat. No. 4,160,893, uses a specialized custom machine which holds a single chip in position on a board while applying localized heating controlled by a thermocouple. This machine would require extensive programming for each type of board to be soldered, and might not be adapted to attach all types of components.

While these known methods may be adequate in certain specialized applications, none provides a simple, reproducible, low-cost, and generalized method of attaching components to any location on a printed wiring assembly while protecting previously attached components from heat and reflowing.

Shielding has been also been used for various purposes in infrared soldering. Costello U.S. Pat. No. 3,718,800 shows an apparatus which is placed on a board and has highly reflective surfaces that direct infrared radiation to specific desired regions, thus preventing the application of radiation to other regions. The Costello apparatus also shields the component being soldered to the board from infrared radiation. Unfortunately, since the Costello apparatus encloses infrared radiation in a desired area rather than shielding all other areas of the board, it is not compatible with a production oven apparatus.

Clearly, there is a need for an improved method and apparatus for soldering components to a circuit board subsequent to a previous soldering operation which does not damage the previously-made solder joints, and which is easily applicable to any circuit board configuration, and which is compatible with a production oven or infrared wave soldering so that large amounts of the circuit boards may be quickly mass-produced.

SUMMARY OF THE INVENTION

Therefore, it is a general object of the present invention to provide an improved apparatus and method for soldering components to a circuit board subsequent to a previous soldering operation so that the previously made solder joints do not experience reflow.

A further object of the present invention is to provide an improved apparatus and method for soldering components to a circuit board subsequent to a previous soldering operation so that the previously made solder joints do not experience reflow, wherein a minimum of customized tooling and fixturing is required.

Another object of the present invention is to provide an improved apparatus and method for soldering components to a circuit board subsequent to a previous soldering operation so that the previously made solder joints do not experience reflow wherein the newly attached components need not be located at a substantial distance from, or on the other side of the board from, the previously attached components.

Yet another object of the present invention is to provide an improved apparatus and method for soldering components to a circuit board subsequent to a previous soldering operation so that the previously made solder joints do not experience reflow which is highly reproducible and reliable.

Another important object of the present invention is to provide an improved apparatus and method for soldering components to a circuit board subsequent to a previous soldering operation so that the previously made solder joints and previously mounted components are not damaged which uses an infrared heating system in conjunction with convection heat.

A further object of the present invention is to provide an improved apparatus and method for soldering components to a circuit board subsequent to a previous soldering operation so that the previously made solder joints do not experience reflow, which uses an infrared heating system in conjunction with convection heat to selectively produce differing temperature levels in different regions of the board.

Another object of the present invention is to provide an improved apparatus and method for soldering components to a circuit board subsequent to a previous soldering operation so that the previously made solder joints are not damaged, in which the board is heated to a first temperature using convection heat, while certain areas of the board are shielded from infrared heat and infrared heat is applied to other areas, so that differing temperature levels are selectively produced in the shielded and unshielded regions of the board.

It is also an object of the present invention to provide an improved apparatus and method for soldering connectors to a circuit board subsequent to a previous component soldering operation so that the previously made solder joints are not damaged, in which the board is heated to a first temperature using convection heat, while the components on the board are shielded from infrared heat and infrared heat is applied to the connectors so that solder at the connectors is reflowed and solder at the components is not reflowed.

Another object of the present invention is to provide an improved apparatus and method for soldering connectors to a circuit board using an infrared oven in which the natural convective heat produced by the oven is balanced with the oven's infrared energy production to produce differing energy levels in identified regions of the board.

Further objects of the present invention will be apparent upon review of the drawings and specification in conjunction with the claims.

These objects and others are achieved through a method and apparatus that utilizes an infrared furnace that produces both infrared wave and convection heating to make additional solder joints on the printed wiring assembly. In the method of the invention, additional components, along with additional solder to be reflowed to form new solder joints, are placed on the assembly. A titanium shield is placed over the board to cover the already completed solder joints which are not to undergo reflow, and the assembly is passed through the oven. The convection heating of the oven, which may the convection heat produced by the IR elements or a separate convection source, is set to warm the entire printed wiring assembly to a temperature which remains below the reflow temperature of the solder used to attach the preexisting components. The infrared wave heating of the oven is applied over the entire board, but is prevented from impinging upon the previously completed solder joints by the shield. The reflow of the newly added solder occurs as a result of the simultaneous application of both the convective heat and radiative heat applied to the unshielded portions of the printed wiring board.

DETAILED DESCRIPTION OF THE PREFERRED EMBODIMENT

Broadly, the present invention is an apparatus and method of applying heat energy to a region of a printed wiring assembly while limiting the amount of heat energy which is applied to another region of the assembly. The present invention is particularly applicable to printed wiring assembly construction processes in which a first group of components must be soldered to a board in a first process step, and additional components must be soldered to the resulting assembly in a later process step.

SHIELDING

Figure 1:
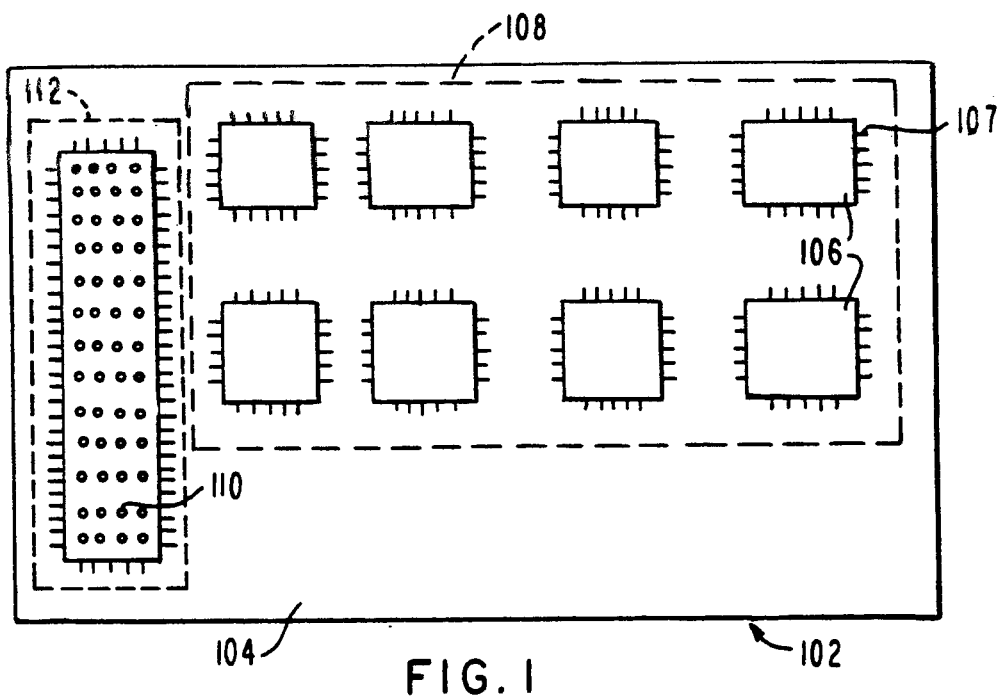
FIG. 1 is a top plan view of a printed wiring assembly having components already attached and to which further components are to be attached.

FIG. 1 shows a printed wiring assembly (PWA) 102 comprising a printed wiring board (PWB) 104, one or more surface mount components 106 which have been previously soldered to the PWB 104 of PWA 102 at a plurality of solder joints 107 by any prior art soldering method or alternatively by the method of the present invention.

The surface mount components 106 lie in a protection region 108 within which the application of heat and similar energy to the surface mount components 106, the printed wiring board 104, and the solder joints 107 beyond the reflow temperature of solder joints 107 is to be avoided. There are many reasons why the application of energy or the heating of the surface mount components 106, the printed wiring board 104, and the solder joints 107 to the reflow temperature of solder joints 107 may be undesirable. These elements may be damaged or in any event made less reliable by the application of heat and related energy. The solder joints 107 may be reflowed so that the surface mount components 106 become disassembled from or misaligned with respect to the printed wiring board 104, or so that the electrical connections are made less reliable. Application of heat and like energy may further cause scorching of some of these elements. Finally, in some applications, reflow of the solder joints 107 may be proscribed by purchaser specifications or the number of reflows permitted may be limited, so that the opportunities for reworking a defective PWA 102 are limited. For example, military specifications regularly limit the reflowing of solder joints such as solder joints 107.

The protection region 108 may be of any shape and size, and there may also be a plurality of protection regions 108. The protection region 108 might also encompass the entire PWA 102 or, as will be described in more detail later, may encompass the entire PWA 102 except for one or more cutout portions of relatively limited size. While the protection region 108 has been described as containing previously soldered surface mount components 106, the protection region 108 might also contain additional or different items. What is important is that the protection region 108 be a region in which it is desired to limit the application of heat or similar energy.

As shown in FIG. 1, the PWA 102 also includes a connector 110 which is not yet soldered to the PWB 104 of PWA 102 but which has contacts matching up at specified locations with contacts of the PWB 104, the respective contacts of the connector 110 and the PWB 104 being attachable using solder. The connector 110 lies in a reflow region 112 wherein it is desirable to apply heat or similar energy so as to reflow solder. As will be described in detail later, it is desired in the present process to reflow or melt solder which has been applied to the connector 110 so that the contacts of the connector 110 are soldered to appropriate contacts of PWB 104.

The reflow region 112 has been described as including the connector 110, but the reflow region could include any item to which heat or energy application is desired. The connector 110 is used as an example because the process of the present invention is particularly useful in attaching connectors to boards that also contain other devices. Connectors differ from surface mount devices in that they are frequently provided with gold pin contacts which cannot be coated with solder. As a result, such connectors may not be attachable by the same process, such as wave soldering, that is preferred for attaching other components. Differing types of components on the same PWB 104, such as connectors and surface mount devices, may as a result require multiple processes for their attachment. The process disclosed herein permits the use of more than one process in sequential order on the same PWA 102, and therefore is of particular value in attaching connectors to boards carrying surface mount devices. Further, connectors are often large and may be mounted in positions where they would shield other components from a solder wave if the connector were present during wave soldering. Therefore, a later attachment of the connector may be necessary. Again, such a construction method is facilitated by the apparatus and method of the present invention.

The reflow region 112 is preferably distinct from the protection region 108. One of the many advantages of the present process is that it can be controlled to produce quality solder joints in the reflow region 112 without reflowing solder in the protection region 108, even when the distance between the protection region 108 and the reflow region 112 is relatively small. However, preferably PWAs 102 designed for use with the present process will be designed with a minimum space between components which will be attached in a prior operation and components which will be attached in a later operation. In some cases, adjacent components and plated-through holes in prior art PWAs 102 are located in very close proximity to the locations of items that will be attached using the process of the present invention. In these cases, it is difficult to adjust the process parameters according to the present invention to reflow the solder as required to attach the desired items, without reflowing the solder on the proximate adjacent components and plated-through holes. Preferably, the requirements of the present process will be taken into account during the design stage of the board, and adjacent components and plated-through holes will therefore be kept at a minimum specified distance from the locations of items to which the present process is to be applied.

Figure 2:
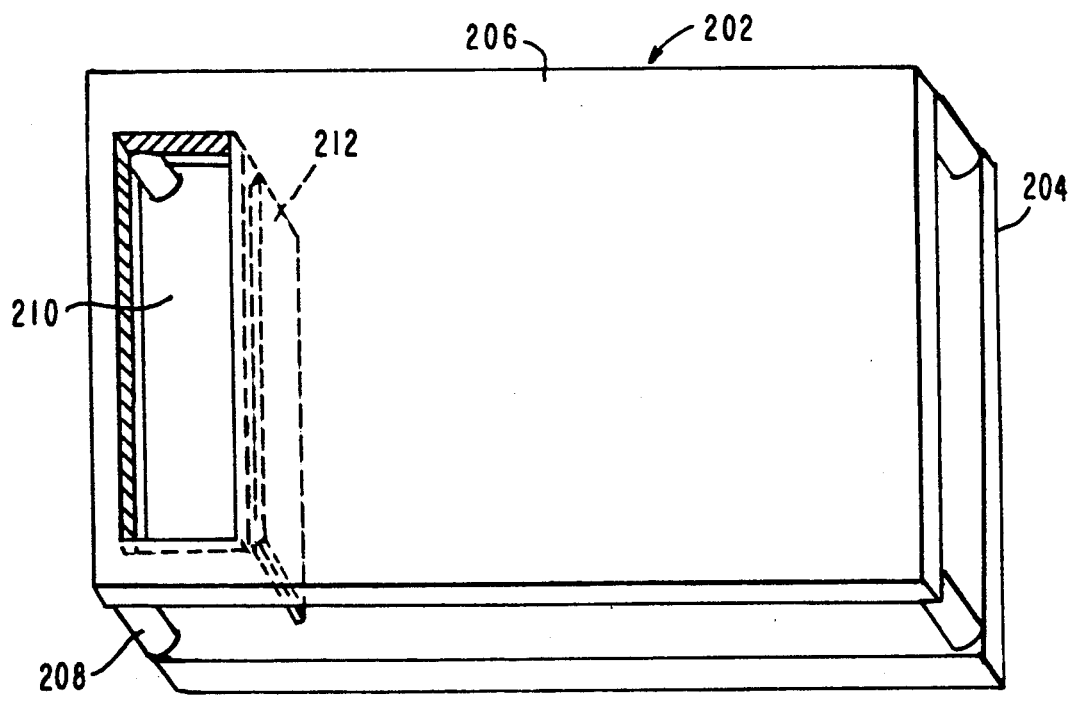
FIG. 2 is a perspective assembly drawing showing a shield according to the present invention and designed for the printed wiring assembly of FIG. 1.

FIG. 2 shows an embodiment of a shield according to the present invention. As shown in FIG. 2, shield 202 is adapted to engage the PWA 102 of FIG. 1 so as to cover the protection region 108 of PWA 102. The shield 202 comprises a bottom panel 204 and a top panel 206 connected by four spacing posts 208 located at the corners of the panels 204 and 206. In the top panel 206, there is provided a cutout 210 corresponding approximately in size and shape to the reflow region 112 of the PWA 102 for exposing the reflow region 112 of the PWA 102 to radiated energy. The spacing posts 208 are preferably aluminum rod stock ¼" in diameter and may be of any desired number and location appropriate to the configuration of the PWA 102. The spacing posts will be of a length appropriate to the thickness of PWA 102 so that PWA 102 with its associated components 106 can be fitted between panels 204 and 206. The spacing posts 208 are attached to the panels 204 and 206 by appropriate connecting means such as adhesives, fasteners, welding, or brazing. A preferred method of attaching the spacing posts 208 to the panels 204 and 206 is by drilling a clearance through-hole along the longitudinal axis of spacing posts 208 and bolting the spacing posts to the panels 204 and 206.

Front panel 206 and back panel 204 are preferably constructed from a titanium sheet 0.040" in thickness. For durability and reflectivity respectively, the front panel 206 and back panel 204 are preferably plated with electroless nickel (plating thickness 0.0003") and also plated with a layer of gold 0.000050" thick.

Titanium is preferred as the material for front panel 206 and back panel 204 because titanium has a low thermal conductivity. Use of a front panel 206 and back panel 204 with low thermal conductivity prevents excess heating of the solder joints 107 on the PWB 104, and also prevents the panels 206 and 204 from "soaking up" heat from the IR oven (which could cause inconsistencies in heat loading and oven throughput). By comparison, initial experiments with an aluminum sheet-metal front panel 206 and back panel 204 showed that aluminum was less effective as a panel material in that it produced little difference in temperature between the protection region 108 and the reflow region 112 of the PWB 104. Due to the high thermal conductivity of aluminum, the air mass inside the shield 202, and consequently the PWB 104, are heated rapidly. Aluminum foil is even less desirable as a shield material since when using foil, the components are tightly wrapped with hardly any air mass entrapped, and thermal transfer speed is thus increased.

As noted previously, the titanium of front panel 206 and back panel 204 is preferably plated with a bright gold finish in order to reflect IR energy from the shielded area. Earlier experiments with an unplated titanium shield showed that it was indeed desirable to use a bright finish since the thermal gradient between the inside of the shield and the unshielded area was insufficient with a less reflective finish. Chromium or another highly reflective metal could also be used as the bright finish rather than gold, although chromium may be more difficult to plate onto titanium.

In addition, the shield 202 of FIG. 2 may include a side shield 212. Side shield 212 is a piece of titanium plated similarly to the top panel 206 and bottom panel 204 of shield 202. Side shield 212 will preferably have the same shape as the side of the cutout 210. Side shield 212 may be attached to the top panel 206 or may be detachable to facilitate insertion of the PWA 102 in shield 202. The purpose of side shield 212 is to reflect infrared energy away from the protection region 108 of PWA 102 and toward the reflow region 112 of PWA 102 (these regions are shown in FIG. 1). Of course, depending on the relative locations of protection region 108 and reflow region 112 on PWA 102, side shield 212 may be appropriately located on any side of the cutout 210, and more than one side shield 212 may be provided for any cutout 210.

Figure 3:
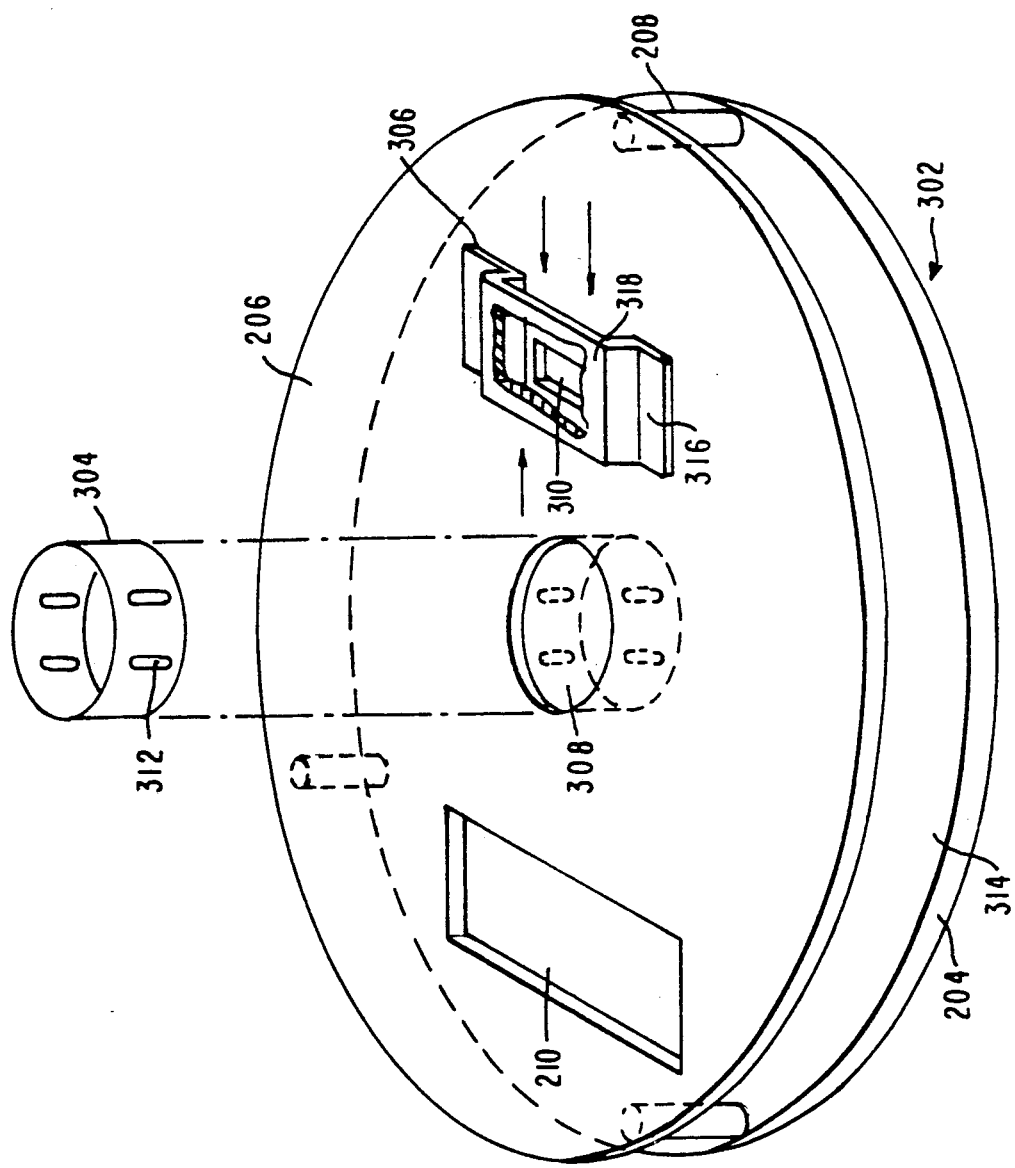
FIG. 3 is a perspective assembly drawing showing another embodiment of the shield of FIG. 2 designed for use with a circular-shaped printed wiring assembly and having added ventilation means.

Referring now to FIG. 3, another embodiment of the shield 202 is shown at 302; this embodiment is appropriate for use with a generally circular PWA 102 having a center hole, such as might be installed in a U.S. Navy torpedo. The shield 302 comprises a back panel 204, a front panel 206, and spacing posts 208 assembled in the same manner described previously with reference to shield 202 in FIG. 2. The shield 302 further comprises a chimney 304 and a vent cover 306.

Where the device to be attached to PWA 102 by the present process, such as connector 110, lies close to the center of the PWA 102, there may be insufficient heating at that point to obtain solder reflow temperature. As illustrated in FIG. 3, the convective energy on the board at any point can be increased by providing ventilation holes such as round ventilation hole 308 or ventilation slot 310 in shield 302 in the region requiring greater convection heating. Such ventilation holes could be provided at any point in either the front panel 306, the back panel 304, or both as determined by experimentation using a thermocouple-equipped dummy PWA 102.

In the shield 302, as shown in FIG. 3, a circular ventilation hole 308 is provided in the top panel 206. Ventilation hole 308 is of the same diameter as chimney 304 and receives the chimney 304. After insertion of the round PWA 102 into the shield 302, the chimney 304 is inserted into ventilation hole 308, which lies above a larger center hole in the PWA 102 (not shown), so that chimney 304 passes through the center hole of PWA 102 and abuts bottom panel 204 of shield 302. Chimney 304 is removable to allow insertion of the round PWA 102 into the shield 302. For this application, the round ventilation hole 308 and chimney 304 might be about one and a half inches in diameter. The chimney 304 may be made from any desired material, such as aluminum or titanium, and is provided with a plurality of slots 312 which permit the passage of convective air from the top of shield 302, through the chimney 304, and into the center region 314 of the shield 302 and vice-versa. The chimney 304 can be rotated in the round ventilation hole 308 for more precise direction of convective energy. If desired, a hole corresponding to round ventilation hole 308 could be provided in the bottom panel 204 to permit exchange of convective energy between the area beneath bottom panel 204 and the center region 314 of shield 302 through the chimney 304.

The round ventilation hole 308 and chimney 312 are particularly appropriate for use when PWA 102 has a hole in the region where increased convective ventilation is needed. If PWA 102 does not have a hole at the necessary location, other embodiments of the ventilation method disclosed herein can be used. For example, as shown in FIG. 3, a ventilation slot 310 of any desired dimension and shape could be cut in top panel 206. The vent cover 306 is attached to the top panel 206 and has a reflective top surface and a nonreflective underside. The vent cover 306, as shown, is a folded titanium sheet having attachment portions 316 which lie flush against top panel 206 for attachment thereto, and a projection portion 318 which covers the ventilation slot 310 but does not contact the surface of top panel 206. The projection portion 318 of vent cover 306 defines a convection flow path from the top of top panel 206, then between projection portion 318 and top panel 206, through ventilation slot 310 to center region 314 of shield 302 and vice-versa. The vent cover 306 substantially blocks infrared radiation from passing through the ventilation slot 310 while permitting the passage of convection energy. One embodiment of the vent cover 306 has been shown, but the vent cover 306 as contemplated by the present invention could be of any design that facilitates the objective just described. The vent cover 306 could be attached to the underside of the top panel 206, or ventilation might be provided in the bottom panel 204.

Ventilation as described herein, including the round ventilation hole 308 and chimney 304 embodiment and the ventilation slot 310 and vent cover 306 embodiment, might be installed at any desired location on the top panel 206 or bottom panel 204 in accordance with test data indicating that these locations need increased convection heating. To promote clarity in FIG. 3, the ventilation slot 310 and vent cover 306 are shown installed at a distance from the cutout 210 where solder reflow is desired. In practice, since increased convection heating will normally be desired close to the cutout 210, the ventilation slot 310 and vent cover 306 would more likely be located in close proximity to the cutout 210, in the area of the top cover 206 between cutout 210 and round ventilation hole 308 as shown in the drawing.

Prior to the placement of the PWA 102 in the infrared oven, as will be described later in detail, solder is applied to the places in the reflow region 112 where it is desired to form solder joints. In the example shown in FIG. 1, these locations would be the connecting pins of connector 110 which are to be connected to appropriate terminals on the PWB 104. The solder may be applied by any known method. The preferred method in the case of mounting a connector such as connector 110 is to provide solder preforms on each connecting pin of connector 110. The solder preforms may preferably be donut shaped in order to fit over the connector pins, and will be coated with 1% RMA flux quantity by weight to aid in reflow. The RMA flux can be applied using a squeeze bottle or, more preferably, may be applied in measured quantity in an automated process. The preform size and shape will be determined by the construction of the connector pins of connector 110. Several critical factors influence the choice of preform size. The preform must remain small enough in outside diameter so as not to interfere with adjacent preforms during reflow and must have an inside diameter which allows it to fit smoothly down onto the connector pins of connector 110 without binding. The height of the preform will affect the final solder fillet height on the pin and therefore must also be closely controlled.

Process Equipment Structure and Settings

Figure 4:
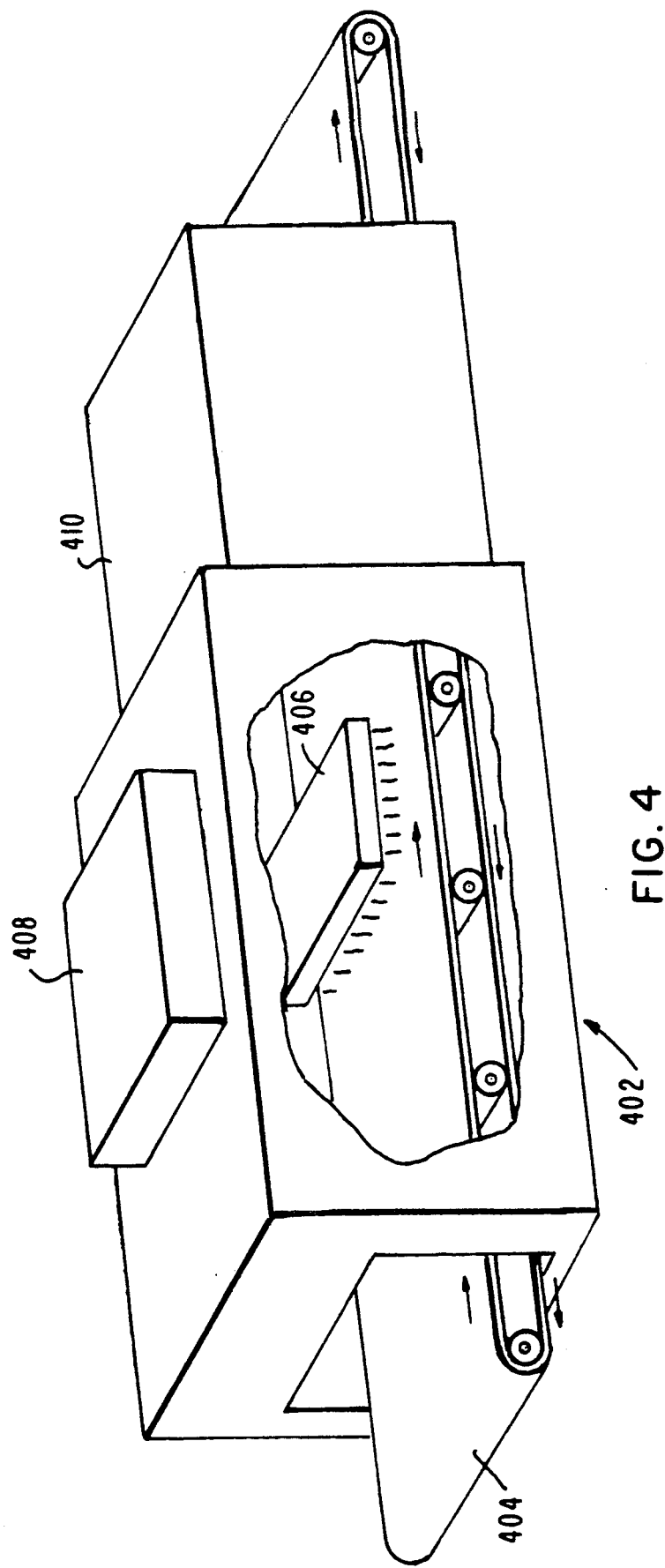
FIG. 4 is a diagram showing the preferred embodiments of the apparatus used in the method of the present invention.

Referring now to FIG. 4, an embodiment of the processing equipment according to the present invention is shown. The processing equipment includes an oven 402 provided with a conveyor 404, infrared panels 406, and (optionally) convection heating source 408.

In the first, preferred embodiment, the oven 402 may be a model SMD-318 Infrared Oven as manufactured by Vitronics. This oven 402 has seven sets of infrared panels 406, or zones. There are two basic types of IR ovens presently available, and other types might be developed. The first type utilizes bulbs to emit the IR energy while the second type uses an emitter panel. The system which is preferred in the present application is of the emitter panel or area source type because of the evenness of infrared energy application produced by this type of oven. The laminates of a typical PWB 104 typically absorb IR radiation in the 4-8 micron wavelength range. Since the successful reflow of solder depends upon the ability of the material to absorb IR radiation (emissivity) and thus increase temperature, it follows that the IR source must be capable of efficient radiation in the same range as the emissivity of the material being heated. It has been found through experimentation that the emissive power of area source type ovens falls directly in the range where the PWB 104 laminate material will absorb IR energy most efficiently. Those skilled in the art will appreciate that a different oven type might be preferred for laminate materials with a different emissivity.

Figure 5:
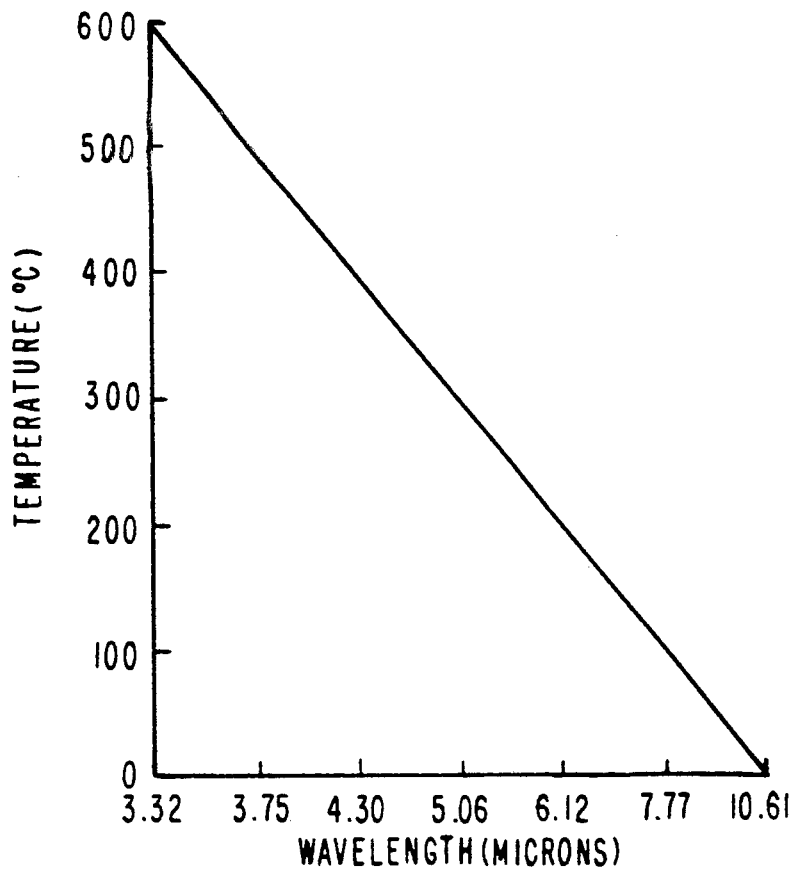
FIG. 5 is a graph showing the relationship between the temperature of infrared panels in the apparatus of FIG. 4 and the wavelength emitted by the panels.

The settings of the infrared panels 406 in the oven 402 are significant parameters in the process of the present invention and will now be described in detail. As noted previously, the oven 402 has seven separately settable zones each comprising at least one infrared panel 406. The inventors have determined that the typical IR process involves only about 40% direct IR energy transfer to accomplish heating while the remaining 60% is accomplished through byproduct convection produced by the elevated temperature of the infrared panels 406 of the oven 402. FIG. 5 is a graph showing the relationship between the temperature of infrared panels 406 and the IR wavelength transmitted by the infrared panels 406. As can be seen from FIG. 5, longer wavelengths of infrared energy produce considerably less convection heat than do shorter wavelengths. According to the present invention, the output wavelength and power level of infrared panels 406 are varied so that infrared panels 406 produce a desired level of infrared energy and a desired level of convection energy. What is generally desired is that the level of convection energy be sufficient to heat the PWA 102 to a temperature which is below the reflow temperature of solder used to connect components to PWA 102 in previous operations. The level of infrared energy desired is sufficient to heat exposed portions of PWA 102 so that, in combination with the energy provided to PWA 102 by convection, the exposed portions (but not covered portions) are raised beyond the solder reflow temperature so that reflow takes place in the exposed portions. A wavelength for the output of infrared panels 406 can be chosen to produce a certain temperature according to FIG. 5 so that this desired convection temperature is produced.

Figure 6:
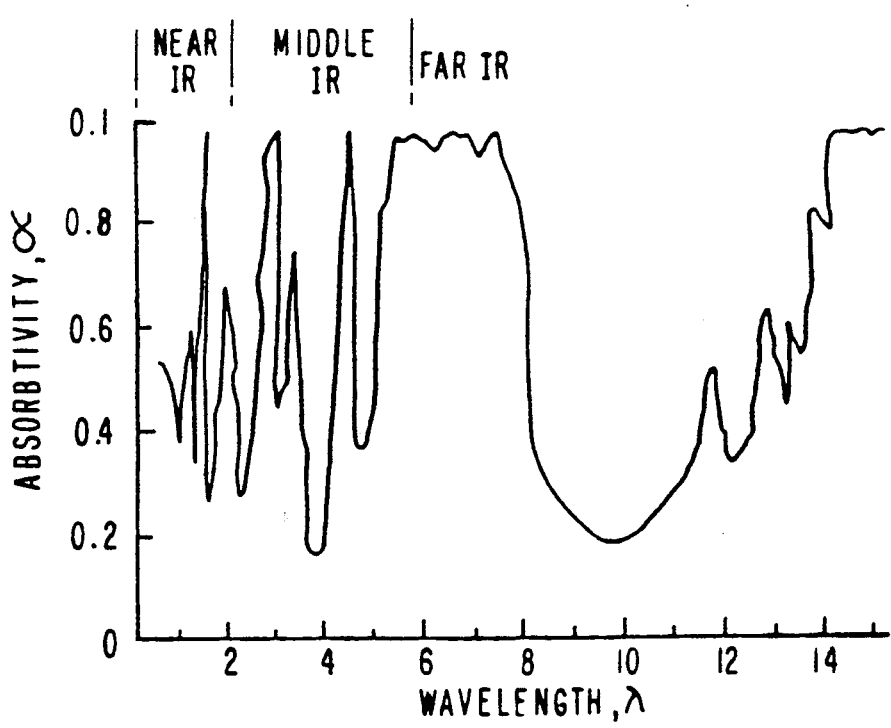
FIG. 6 is a graph showing the relationship between infrared wavelengths and the heat absorbtivity of air.

FIG. 6 shows the relationship between IR wavelengths and the absorbtivity of air, which is also relevant to determining an output wavelength for infrared panels 406 in that the absorbtivity of air at a given wavelength determines the amount of infrared energy of a particular wavelength that will reach PWA 102 as opposed to being absorbed by the air. At wavelengths where the absorbtivity of the air is greater, more convection heat and less infrared radiation heat will be produced. The power level of infrared panels 406 at the desired wavelength must be chosen so that, considering the absorbtivity of air, the infrared energy on the reflow region 112 of PWA 102 (shown in FIG. 1) will be sufficient in combination with the convection energy available to cause solder reflow in the reflow region 112.

For example, an infrared panel 206 can be set to 450 degrees C. where the wavelength of radiation is 4.0 microns and the absorptivity of air is less than 0.2, and the PWA 102 will be primarily heated by direct impingement of IR radiation. Alternatively, infrared panels 406 can be set to 371 degrees C. where the wavelength of the radiation is 4.5 microns and the absorptivity of air is approximately 0.9, and the PWB will be primarily heated by convection. According to the preferred embodiment of the present invention, the wavelength will be set to a midrange level to produce both infrared and convection heating, such as the sample levels given in Table 1 below.

Figure 7:
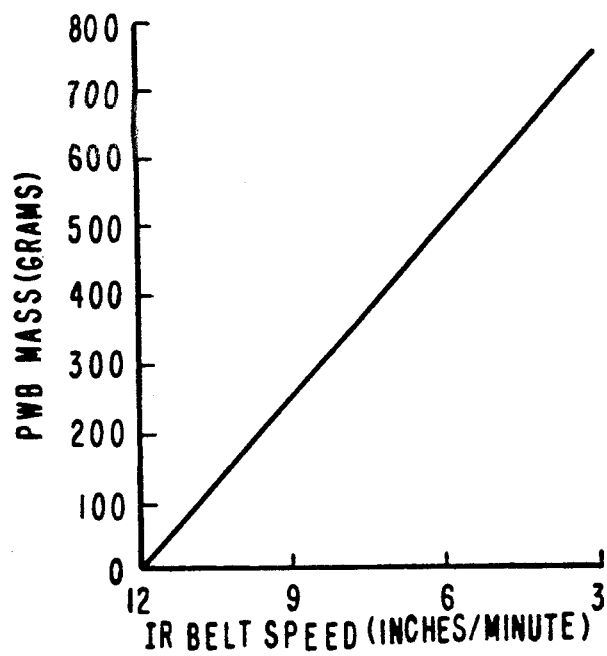
FIG. 7 is a graph showing the variation in desired oven belt speed with the mass of the printed wiring board.

To achieve the desired results according to the present invention, it is also necessary to set the speed of conveyor 404. In general, the mass of the PWB 104 and the speed of conveyor 404 will be inversely correlated since a larger, more massive PWB 104 will require greater total energy application, and thus longer exposure time produced by a slower conveyor speed, to reach a specified temperature. For the apparatus as described herein, an approximate appropriate speed for conveyor 404 for PWBs 104 of a given mass is shown in FIG. 7. The graph of FIG. 7 is based on data using two boards, one weighing 751 grams and one weighing 622 grams. Within reasonable limits, there is a straight line correlation between weight of PWB 104 and the required speed of conveyor 404. Therefore, by keeping the temperature in the oven 402 constant for a group of boards such as medium to heavy weight boards, or light to medium weight boards, it is possible to theoretically predict the appropriate conveyor speeds and thereby achieve connector reflow soldering with ease.

Table 1 gives examples of appropriate temperatures for infrared panels 406 and appropriate speeds for conveyor 404, all according to the given masses of PWB 104. The values given are appropriate for a solder reflow temperature of 183 degrees C.

TABLE 1
SAMPLE PROCESS PARAMETERS

| | | | |
|---|---|---|---|
| PWB Mass (grams) | 479.4 | 622 | 751 |
| Conveyor Speed (in/min) | 4.5 | 4.5 | 3.0 |
| Zone 1 setting (deg. C) | 400 | 400 | 400 |
| Zone 2 setting (deg. C) | 400 | 400 | 400 |
| Zone 3 setting (deg. C) | 400 | 445 | 445 |
| Zone 4 setting (deg. C) | 445 | 445 | 445 |
| Zone 5 setting (deg. C) | 400 | 400 | 400 |
| Zone 6 setting (deg. C) | 400 | 445 | 445 |
| Zone 7 setting (deg. C) | 445 | 445 | 445 |

It has been found that by keeping the temperature in the oven 402 constant and varying the speed of conveyor 404, temperature gradients and solder liquidus times at temperature on PWB 104 can be altered as may be desired. Similarly, by placing a piece of refractory material such as titanium at one side of the connector 110 of PWA 102 as described previously, so that infrared radiation is reflected back onto the connector 110, temperature gradients and solder liquidus times at temperature can be further altered.

For high speed production, by providing a longer oven 402 than the Vitronics oven described herein, a longer time of exposure to the energy produced by oven 402 would be realized, and the speed of conveyor 404 could thus be increased beyond the speeds shown in Table 1.

Although the graphs of FIGS. 5-7 provide guidance in setting the process parameters, it is best to determine precise optimal settings for the infrared panels 406 using a test PWB having the same shape and general characteristics as PWB 104. This test PWB will be fabricated with thermocouples placed in various regions of interest in order to determine the required process parameters, including temperature/wavelength and the travel speed of conveyor 404. As described previously with reference to FIG. 3, the test PWB should also be used to determine appropriate configurations and locations for ventilation means in the shield 302 if such ventilation means are required.

In a second embodiment of the present equipment, the oven 402 could be provided with a separate convection heating system 408, such as an electrical heating or forced air system. In this embodiment, the energy contributions of the convection heating system 408 and the infrared panels 406 would again be balanced in accordance with the precepts of the present invention so that the oven 402 heats PWA 102 using convection heat to a level below the reflow temperature of solder, and defined areas of PWA 102 are further heated by infrared panels 406 to cause reflow of the solder in those areas. This embodiment requires additional equipment, so is less preferred in general. However, for some designs of PWA 102, this second embodiment permits improved process control since the operator can vary not only the speed of conveyor 404 and the wavelength and intensity of infrared panel 406, but also the ambient temperature provided to PWA 102 in the oven 402 prior to the application of energy from infrared panels 406.

Finally, a cleaning process should be provided for the PWAs 102 which have had components attached according to the process disclosed herein. The preferred cleaning process is a conventional process using a Detrex in-line defluxer (not shown) with an integral distillation system. The preferred solvent is Dow Prelete, a 1,1,1-Trichloroethane based mixture.

Operation and Results

In the method according to the present invention, the PWA 102 of FIG. 1, previously having had components soldered thereto in the protection region 108, is provided with a component to be soldered thereto by the present process (such as a connector 110 shown in FIG. 1). Solder is also provided at appropriate locations, preferably in the form of solder preforms.

The PWA 102 is then placed in an appropriately configured shield 202 or 302 (illustrated in FIGS. 2 and 3 respectively). Any side shields 212 or chimneys 304 are installed as required.

The process equipment, including oven 402 and defluxer 410, as illustrated in FIG. 4, is programmed to operate with parameters calculated according to the precepts disclosed herein so that a temperature below solder reflow temperature will be produced in the protection region 108 while a temperature above the solder reflow point will be produced in the area of the connector 110.

The PWA 102 is then placed on the conveyor 404 of oven 402 and passes through the oven 402. The connector 110 is soldered to the PWA 102 while the solder joints 107 in protection region 108 are not affected. After passing through the oven 402, the PWA 102 is allowed to cool and is removed from the shield 202 or 302 and defluxed.

Figure 8:
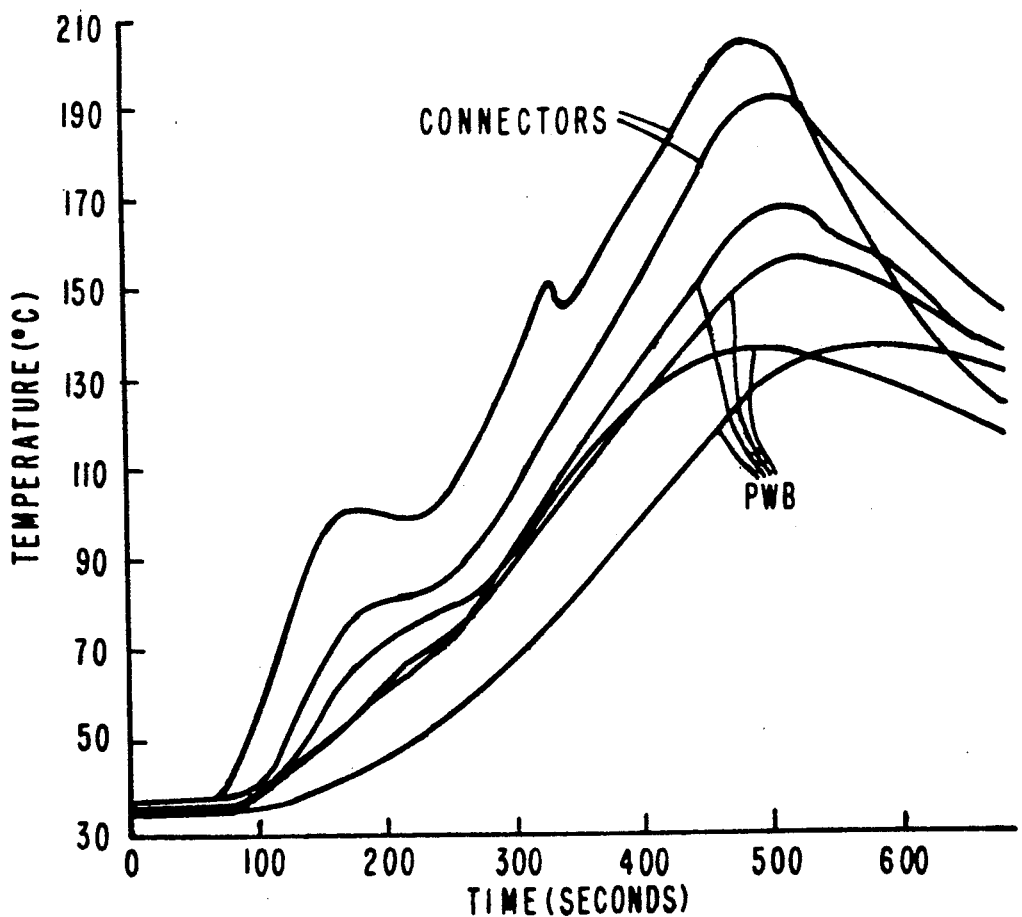
FIG. 8 is a graph showing the temperature of the portions of a printed wiring assembly having shielding according to the present invention as it passes through the properly adjusted apparatus of the present invention as shown in FIG. 4.

This process produces excellent results. Referring now to FIG. 8, a plot of temperature over time during the passage of a test PWB through the oven 402 is shown. The test PWB, as described previously, is provided with thermocouple heat sensing devices at six locations, two in the connector (reflow) region, and four in the protection region (indicated by the designation PWB in FIG. 8). As can be seen in FIG. 8, as the PWA 102 passes through the oven 402, the temperature on the PWA increases to a peak. At peak temperature, the temperature in the protection region never increases above 183 degrees C., the reflow temperature of the solder used in this region. The temperature at the connector locations, which are not shielded from infrared radiation, increases above 183 degrees C. so that the solder reflows, fixing the connectors to the PWA 102.

Sample assemblies of soldered connectors produced according to the method disclosed herein were subjected to thermal cycling from −55 degrees C. to 125 degree C. Metallurgical cross sectioning was then performed after 0 cycles, 15 cycles, and 100 cycles. The metallurgy of the joints did not change appreciably during the cycling and there was no evidence of fracturing or grain boundary sliding which could potentially lead to a premature failure of the solder joint. The evidence of gold intermetallics at the pin to solder interface was minimal and the tin/lead phase appeared homogenous throughout the joint. The geometry of the joint appeared identical from joint to joint across the connector with minimal subsurface voids caused by outgassing.

Thus, a method and apparatus has been disclosed which produces a repeatable, high quality solder joint. Assembly time is reduced dramatically (by a factor of ten) and rework becomes almost non-existent. Joints are repeatable and all aspects of the process adhere to applicable military specifications.

Statement of Industrial Applicability

Broadly, the present invention is an apparatus and method of applying heat energy to a region of a printed wiring assembly while limiting the amount of heat energy which is applied to another region of the assembly. The present invention is particularly applicable to printed wiring assembly construction processes in which a first group of components must be soldered to a board in a first process step, and additional components must be soldered to the resulting assembly in a later process step without reflowing the solder of the first component group.

I claim:

1. A method of forming at least one solder joint on a board assembly having a previously made solder joint without reflowing said previously made joint, comprising the steps of:

positioning a quantity of solder onto said board assembly at the location of at least one desired solder joint;

covering said previously made joint with an infrared reflecting shield which leaves the location of said desired solder joint exposed and which permits the passage of convective heat to the entire board assembly;

applying convective heat to the entire board assembly to raise the assembly to an elevated temperature which is below the reflow temperature of the solder used in the previous joint, and applying infrared radiation to the board assembly to raise the temperature of all exposed portions of the board assembly above the reflow temperature of the quantity of solder to form said desired solder joints without reflowing said previously made joint.

2. A method as defined in claim 1, wherein said convective heat and infrared radiation are simultaneously applied.

3. A method as defined in claim 1, wherein said convective heat and infrared radiation are applied in an infrared oven having conveying means for carrying the board assembly through the oven in a controlled time period.

4. A method as defined in claim 2, wherein said convective heat and infrared radiation are applied by a convective heating source and an infrared heating means.

5. A method as defined in claim 4 wherein the infrared heating means is at least one infrared panel.

6. A method as defined in claim 4 wherein the infrared heating means is set to produce infrared radiation at an output wavelength which is selected to produce a desired mixture of convective heat and infrared radiation such that all of said desired solder joints are raised above reflow temperature while the previously made solder joint is not raised above reflow temperature.

7. A method as defined in claim 1, wherein said convective heat raises the temperature of the board assembly to between about 1 degree C. and 60 degrees C. below the reflow temperature of the solder used in the previously made joint.

8. A method as defined in claim 1, wherein said reflecting shield covers all of said board assembly except the locations of the said one or more desired solder joints.

9. A method as defined in claim 1, wherein the reflow temperatures of the solder of the previous joint and the solder of the desired joint are substantially the same.

10. A method as defined in claim 1, wherein said previously made solder joint mounts an electronic component to said board assembly, and wherein said component is covered by said infrared reflecting shield.

11. A shield for board assembly which is to be heated in an oven including a radiative energy source to form at least one desired solder joint at a specific location, the board assembly having at least one previously made solder joint which is not to be reflowed during the oven heating, comprising:

an exterior side facing the radiative energy source having at least one substantially planar reflective means for reflecting radiative energy, said reflective means functioning to shield the portions of said board assembly containing previously made joints which are not to be reflowed from the radiative energy source;

an interior side facing the board assembly having a heat transfer prevention means for slowing the conduction of heat from the exterior side of the shield to the interior side, and radiative passage means in the reflective means for transmitting radiative energy from the radiative heat source to the specified location of the board assembly, wherein the shield includes means for permitting the passage of convective energy to the entire board assembly.

12. A shield as defined in claim 11, wherein the oven also produces convective heat, and the shield permits the passage of convective energy to the entire board assembly.

13. A shield as defined in claim 11, wherein the reflective means is a reflective layer on the exterior side of the shield.

14. The shield of claim 13 wherein the reflective means is a reflective layer of metal.

15. The shield of claim 14 wherein the reflective layer of metal contains nickel.

16. The shield of claim 14 wherein the reflective layer of metal contains gold.

17. The shield of claim 14 wherein the reflective layer of metal contains chromium.

18. A shield as defined in claim 13, wherein said shield further includes heat transfer prevention means on the interior side of the reflecting means for slowing the conduction of heat from the exterior side of the shield to its interior side.

19. A shield for a board assembly which is to be heated in an oven including a radiative energy source to form at least one desired solder joint at a specified location, the board assembly having at least one previously made solder joint which is not to be reflowed during the oven heating, comprising:

an exterior side facing the radiative energy source having at least one substantially planar reflective layer for reflecting radiative energy, said reflective layer functioning to shield the portions of said board assembly containing previously made joints which are not to be reflowed from the radiative energy source;

an interior side facing the board assembly having a heat transfer prevention means including a layer of metal having relatively poor heat conductive properties for slowing the conduction of heat from the exterior side of the shield to its interior side, and radiative passage means in the reflective means for transmitting radiative energy from the radiative heat source to the specified location of the board assembly.

20. The shield of claim 19 wherein the layer of metal of the heat transfer prevention means is titanium.

21. The shield of claim 19 wherein the shield comprises two spaced rigid plates which define a space adapted to hold the board assembly.

22. The shield of claim 21 wherein at least one of the plates includes vent means for allowing the movement of heated gas from one side of the plate to the other.

23. The shield of claim 22 wherein the vent means includes a passage from one side of the plate to the other.

24. The shield of claim 23 wherein the vent means further includes cover means for preventing the flow of radiative energy through the passage while permitting the flow of heated gas through the passage.

25. The shield of claim 24 wherein the cover means is a vent cover.

26. The shield of claim 24 wherein the cover means is a chimney.

27. A shield for a board assembly which is to be heated in an oven including a radiative energy source to form at least one desired solder joint at a specified location, the board assembly having at least one previously made solder joint which is not to be reflowed during the oven heating, comprising:
- two substantially planar rigid plates which are assembled in spaced relationship to define a space adapted to hold the board assembly, with at least one of said plates being constructed of a material having poor heat conduction characteristics for slowing the conduction of heat to the space defined between said plates, and with at least one of the plates including a reflective outer surface for reflecting radiative energy, said reflective means functioning to shield the portions of said board assembly containing previously made joints which are not to be reflowed from the radiative energy source, but having means for permitting the passage of convective energy to the entire board assembly, and
- radiative passage means in the reflective means for transmitting radiative energy from the radiative heat source to the specified location of the board assembly.

28. The shield of claim 27 wherein at least one of the rigid plates includes a layer of metal having relatively poor heat conductive properties for slowing the conduction of heat from one side of said plate to the other side of said plate.

29. A system for forming at least one solder joint at a desired location on a board assembly having a previously made solder joint without reflowing solder in said previously made joint, comprising:
- heating means for simultaneously applying convective heat and radiative heat to all of said board assembly, wherein said convective heat alone is insufficient to cause a reflowing of said previously made joint, and the convective heat and radiative heat together are sufficient to cause reflowing of solder at the desired location, and
- shield means for covering the portions of said board assembly containing the previously made joint to reflect radiative heat so that the solder of said previously made joint is not reflowed, and for permitting the passage of convective heat throughout the entire board assembly.

30. A system as defined in claim 29, wherein said shield means conducts convective heat.

31. A system as defined in claim 29, wherein said shield means has an interior side facing the board assembly and an exterior side facing the heating means and further includes reflective means on its exterior side.

32. The system of claim 31 wherein the reflective means is a reflective layer of metal.

33. The system of claim 32 wherein the reflective layer of metal contains nickel.

34. The system of claim 32 wherein the reflective layer of metal contains gold.

35. The system of claim 32 wherein the reflective layer of metal contains chromium.

36. A system as defined in claim 31, wherein said shield means further includes heat transfer prevention means on the interior side of the reflecting means for slowing the conduction of heat from the exterior side of the shield to its interior side.

37. The system of claim 36 wherein the heat transfer prevention means is a layer of metal having relatively poor heat conductive properties.

38. The system of claim 37 wherein the layer of metal of the heat transfer prevention means is titanium.

39. The system of claim 29 wherein the shield means comprises two spaced rigid plates which define a space adapted to hold the board assembly.

40. The system of claim 39 wherein at least one of the plates includes vent means for allowing the passage of air from one side of the plate to the other.

41. The system of claim 40 wherein the vent means includes a passage from one side of the plate to the other.

42. The system of claim 41 wherein the vent means further includes reflecting means for preventing the flow of radiative energy through the passage.

43. The system of claim 42 wherein the reflecting means is a vent cover.

44. The system of claim 42 wherein the reflecting means is a chimney.

45. The system of claim 29 wherein the heating means is an oven having an infrared radiative heat source.

46. The system of claim 45 wherein the oven further includes a convective heat source separate from the infrared radiative heat source.

47. The system of claim 45 wherein the infrared radiative heat source comprises at least one infrared source which produces both radiative and convective heat.

48. The system of claim 47 wherein the infrared radiative heat source is set to produce infrared radiation at an output wavelength which is selected to produce a desired mixture of convective heat and infrared radiation such that all of said desired solder joints are raised above reflow temperature while the previously made solder joint is not raised above reflow temperature.

49. The system of claim 45 wherein the oven includes conveyor means for carrying the board assembly through the oven in a controlled time period.

50. A method of forming at least one solder joint on a board assembly having a previously made solder joint without reflowing said previously made joint, comprising the steps of:
- positioning a quantity of solder onto said board assembly at the location of at least one desired solder joint;
- covering said previously made joint with an infrared reflecting shield which leaves the location of said desired solder joint exposed and which permits the passage of convective heat to the entire board assembly;
- selecting an infrared output wavelength of an infrared heating device to produce a desired mixture of convective heat and infrared radiation, wherein said convection heat will raise the temperature of the board assembly to between about 1 degree C. and 100 degrees C. below the reflow temperature of the solder used in the previously made joint;
- setting the infrared heating device to produce the selected infrared output wavelength;
- exposing the board assembly to the infrared heating device to raise the entire assembly to an elevated temperature such that the entire board is heated by convective heat to an elevated temperature which is below the reflow temperature of the solder used in the previous joint, and the exposed desired solder joints are heated by infrared radiation above the reflow temperature of the quantity of solder so as to form said desired solder joint without reflowing the previously made solder joint.

* * * * *